(12) United States Patent
Daun-Lindberg et al.

(10) Patent No.: US 6,278,279 B1
(45) Date of Patent: *Aug. 21, 2001

(54) PATH TEST FOR A DC BATTERY BACK-UP SYSTEM

(75) Inventors: Timothy C. Daun-Lindberg; Steven W. Steele, both of Rochester, MN (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/143,539

(22) Filed: Aug. 28, 1998

(51) Int. Cl.[7] .................................................. G01R 31/327
(52) U.S. Cl. ............................................................ 324/427
(58) Field of Search ................................... 324/427, 434, 324/426, 432, 433, 771; 320/121, 124

(56) References Cited

U.S. PATENT DOCUMENTS

| | | | |
|---|---|---|---|
| 4,916,438 | 4/1990 | Collins et al. | 340/636 |
| 5,182,518 | 1/1993 | Stich et al. | 324/511 |
| 5,528,149 | 6/1996 | Chen | 324/433 |
| 5,726,573 | 3/1998 | Chen et al. | 324/429 |
| 5,886,503 | * 3/1999 | McAndrews et al. | 320/121 |
| 5,977,750 | * 11/1999 | Ng | 320/132 |

* cited by examiner

Primary Examiner—Safet Metjahic
Assistant Examiner—J Kerveros
(74) Attorney, Agent, or Firm—Christopher H. Lynt; Grant A. Johnson (57) ABSTRACT

A power supply includes a rectifier which receives alternating current as an input, and which provides an output of direct current pulses at a positive polarity output line thereof with respect to a negative polarity output line thereof. A back-up circuit is coupled between the positive and negative polarity output lines of the rectifier. The back-up circuit includes the series connection of a switching device, a current blocking device, at least one electrical energy source device, and a current measuring device. A circuit protection device may also be provided in the series connection. The back-up circuit can be tested while the rectifier is providing the direct current output pulses by closing the switching device and detecting at least one pulse of a test current flowing through the back-up circuit and/or a terminal voltage of the at least one electrical energy source device during the testing.

30 Claims, 4 Drawing Sheets

PATH TEST FOR A DC BATTERY BACK-UP SYSTEM

BACKGROUND OF THE INVENTION

1. Field of The Invention

The invention relates to the field of power supply back-up systems, and in particular, to the testing of a power supply back-up system.

2. Background Information

In critical applications requiring electrical power, such as computer systems, it is desirable to ensure against an unexpected power outage which could have an adverse effect on the electrical equipment being powered or the task the equipment is performing. In order to provide uninterrupted operation of the electrical equipment when there is a failure of a main power source, it is known to provide a back-up power system, such as an uninterruptible power supply (UPS) (see e.g. Stich et al. U.S. Pat. No. 5,182,518).

There are known a number of different types of back-up power systems suitable for use in the home or office, all of which generally rely on at least one electrical energy storage battery as a source of back-up power. Besides the traditional storage battery based back-up power system, other types of back-up power systems, using electrical generators alone or in combination with storage batteries, for example, are also known. These are generally more suitable to heavy industrial uses with large power requirements, although small portable generators which operate on ordinary gasoline are now available for home or small office use.

Of course, larger generator based systems use turbine generators which require fossil fuels to produce the steam that powers them, or consume some other source of bulk stored energy, such as the kinetic energy of water stored in a hydroelectric dam to power the generator, and are therefore not generally found in the home or office in a typical back-up power system. Solar powered steam turbine electrical generators are also known in which solar energy is focused on a water filled pipe or vessel to produce steam which is used to turn a generator.

Solar cells, also called photovoltaic cells, which rely on solar energy input to produce a DC (direct current) electrical output, are also known as a primary or back-up source of electrical energy. Solar cells, alone or in combination with storage batteries, have particular usefulness in remote areas where traditional power sources, such as electrical utility lines or electrical generators, are not suitable. Also known are wind powered and tide powered electrical generators.

Fuel cells are also known as a primary or back-up source of electrical energy. For a number of reasons not relevant to this disclosure, fuel cells are particularly suitable for use in spacecraft and the like. Another primary or back-up source of energy can be found in nuclear materials which have been used in power supplies in submarines and spacecraft, for example, in the past.

Suffice it to say that, depending on the requirements of the task to which the power system is being applied, any of the above-mentioned energy sources, and other similar sources not mentioned, may be used as a primary and/or back-up power supply.

One type of back-up power system which uses one or more electrical storage batteries is referred to herein as a battery back-up unit (BBU). In a BBU, a direct current (DC) voltage and current required by the electrical equipment being backed-up, also referred to as the load, may be provided directly by the one or more batteries upon failure of the main power source in a power supply. Upon failure of the main power source in the power supply, the one or more batteries are automatically connected to the output to power the load. The one or more batteries are connected in an electrical circuit referred to herein as the battery path. For an example of a known battery back-up power system, see Chen U.S. Pat. No. 5,528,149 or Chen et al. U.S. Pat. No. 5,726,573.

Known back-up power systems may use one or more batteries in combination with an inverter to provide an alternating current (AC) output from the DC provided by the batteries (see e.g. Stich et al. U.S. Pat. No. 5,182,518). The AC back-up output is supplied directly to the equipment being backed-up if it operates on an AC input, or after the inversion, rectified into a DC voltage through additional circuitry (see e.g. Collins et al. U.S. Pat. No. 4,916,438).

Thus, back-up power circuitry having a battery (or other DC source) can be connected to provide an AC source of back-up power through the use of an inverter, or to provide a DC source of back-up power, depending on the requirements of the electrical equipment being backed-up. Some computer systems may be provided with an optional battery back-up unit (BBU) inside the computer cabinet which is connected to provide a DC source should the DC output of the main power supply fail, either because of a main power supply component failure, or because of a loss of power input to the main power supply (e.g., an electrical utility outage).

To ensure that a back-up power system, such as a battery back-up power system (BBU), is in good operating condition such that it will function properly when needed, it is prudent to monitor/test the back-up power system from time to time. In a BBU, for example, a battery path test should be done to determine that all the components in the path from the battery to the circuits being backed-up, i.e., the load, work properly.

A path test is typically done at the beginning of a battery capacity test or when a system is first powered on. There are a number of different known ways to accomplish monitoring/testing of back-up power systems (see supra. Stich et al., Chen, Chen et al., or Collins et al., for example).

However, a battery path test implementation may require that the system being backed-up operate on the back-up battery energy for a period of time to get a realistic full load test. This has been done in the past by disconnecting the main power source and connecting only the back-up battery power, and observing the result. While the load is being supplied with power from the back-up power system, measurements are made to ascertain various parameters, such as the current and voltage capacity of the back-up power system.

However, a problem/limitation of such a procedure, which is particularly relevant where the load is a computer system, for example, is that if the back-up power system does not operate properly during the testing, the computer system (load) might "crash." This is one reason that in the past, a path test was typically done at the beginning of a battery capacity test or when a system is first powered on, i.e., at a predetermined time when precautions can be taken so that the failure of the test has minimal impact on the computer system. In the past, to minimize the risk of a system crash, periodically testing the back-up power system may have required the computer system be taken off-line or shut-down, which is inefficient and uneconomical.

In the past, if, during a path test of a BBU back-up power system, a component in series with the battery failed, the system connected to the back-up power system being tested could crash. (The irony of this should be appreciated, since one purpose of having such a back-up power system in the first place is to avoid a computer system crash in the event of a main power failure.) Computer system crashes are particularly troublesome since there is the risk of loss of valuable data, and because a considerable amount of time is often required to restart a computer system after a crash.

Further, since a fault in the back-up power system may develop at any time, even after the back-up power system passes a start-up test successfully, i.e., before the next test which would detect the fault, and since a main power system failure could occur at any time in the interim, frequent testing, and/or redundant systems, may be required to minimize such a possibility.

As can be readily appreciated, many other programmable (and other) systems besides computer systems could be adversely affected by a failure of a back-up power system during testing. Examples include video cassette recorders (VCR's) and television (TV) sets which may have to be reprogrammed after a loss of power.

The problem is, therefore, that a realistic test requires the load to be operated on the back-up power, but if the back-up power fails during the test, the system being backed-up might be adversely affected, e.g., crash. However, taking a system off-line to test the back-up power system can be costly and inefficient. Also, to minimize the possibility of a failure of the back-up power system in a real emergency, it should be tested as frequently as possible to detect faults in a timely manner.

For the above reasons, it would be desirable to be able to periodically test the back-up power system at any time, even while the backed-up system (computer) is performing critical operations, without risking a crash should the back-up power system fail during the testing.

Therefore, a need exists for a way to test a back-up power system at any time during operation of the equipment being backed-up. This requires eliminating the risk of adversely affecting the equipment being backed-up, such as crashing a computer system, for example, during the testing.

In particular, it is desirable to provide a back-up power system battery path test such that its implementation results in zero risk of affecting a system connected to the back-up power system.

SUMMARY OF THE INVENTION

It is, therefore, a principal object of this invention to provide a method and apparatus for testing a back-up power system.

It is another object of the invention to provide a method and apparatus that solves the above mentioned problem so that the back-up power system can be tested under realistic conditions at any time without adversely affecting the equipment being backed-up should the back-up power system fail during the test.

These and other objects of the present invention are accomplished by the method and apparatus disclosed herein.

According to an aspect of the invention, a power supply includes a rectifier and a battery back-up circuit in the form of a series connection of a switching device, a current blocking device, at least one electrical energy storage battery, and a current measuring device. A circuit protection device, such as a fuse, circuit breaker, or the like, would also be provided in the series connection to protect the battery back-up circuit. The battery back-up circuit can be tested while the rectifier is providing a rectified AC output, i.e., direct current output pulses, by closing the switching device and detecting at least one pulse of test current flowing through the battery back-up circuit, and/or a terminal voltage of the (at least one) electrical energy storage battery.

According to an aspect of the invention, the switching device comprises at least one of: a mechanical switch; a relay switch; a reed switch; and a solid state switching device, for example. The solid state switching device comprises at least one of: a bipolar transistor; a field effect transistor; and a silicon controlled rectifier, for example.

According to another aspect of the invention, the rectifier comprises a half-wave rectifier, a full-wave rectifier, or a full-wave bridge rectifier, for example.

According to another aspect of the invention, the current blocking device comprises a diode, e.g., a solid state diode.

According to another aspect of the invention, the current measuring device comprises a resistance, a capacitance, an inductance, a Hall effect device, or a pulse current transformer, for example.

According to another aspect of the invention, the (at least one) electrical energy storage battery comprises a plurality of battery packs, e.g., 12 or 48 volt battery packs. Alternatively, any electrical energy source in place of the storage battery. For example, a dry cell electrical storage battery, a wet cell electrical storage battery, a fossil fuel powered electrical generator, a hydroelectric powered electrical generator, a wind powered electrical generator, a tide powered electrical generator, a solar powered steam turbine electrical generator, a nuclear powered steam turbine electrical generator, a fuel cell, or a photo-voltaic cell.

According to another aspect of the invention, the DC voltage output pulses (rectified AC) provided by the rectifier have a peak voltage greater than a terminal voltage of the battery back-up circuit, whereby when the switching device is closed, and the instantaneous voltage of the output of the rectifier drops below the terminal voltage of the battery back-up circuit, the test current flows through the battery back-up circuit.

According to another aspect of the invention, the alternating current input is from a nominal 220 volts root-mean-square source, the peak voltage of the DC voltage output pulses (rectified AC) provided by the rectifier is approximately 311 volts, and the terminal voltage of the battery back-up circuit comprises approximately 192 volts minus any voltage drops and/or threshold voltages of the series connection components. When the switching device is closed and the instantaneous voltage of the output of the rectifier drops below approximately 192 volts, the test current flows through the battery back-up circuit.

According to another aspect of the invention, a path test method for a back-up power system is provided. In particular, a method of testing a back-up power system in/connected to a power supply without adversely affecting an electrical device load being backed-up, includes supplying pulses of DC voltage to the load at output terminals of the power supply. While the pulsed DC voltage is being supplied to the load at the output terminals of the power supply, the back-up power system is connected to the output terminals of the power supply. At least one electrical parameter of the back-up power system is then detected.

According to an aspect of the invention, at least one electrical parameter of the back-up power system is a current magnitude flowing through the back-up power system, and/or a terminal voltage of the back-up power system, for example.

These and other aspects of the invention will become apparent from the detailed description set forth below.

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Figure 1:
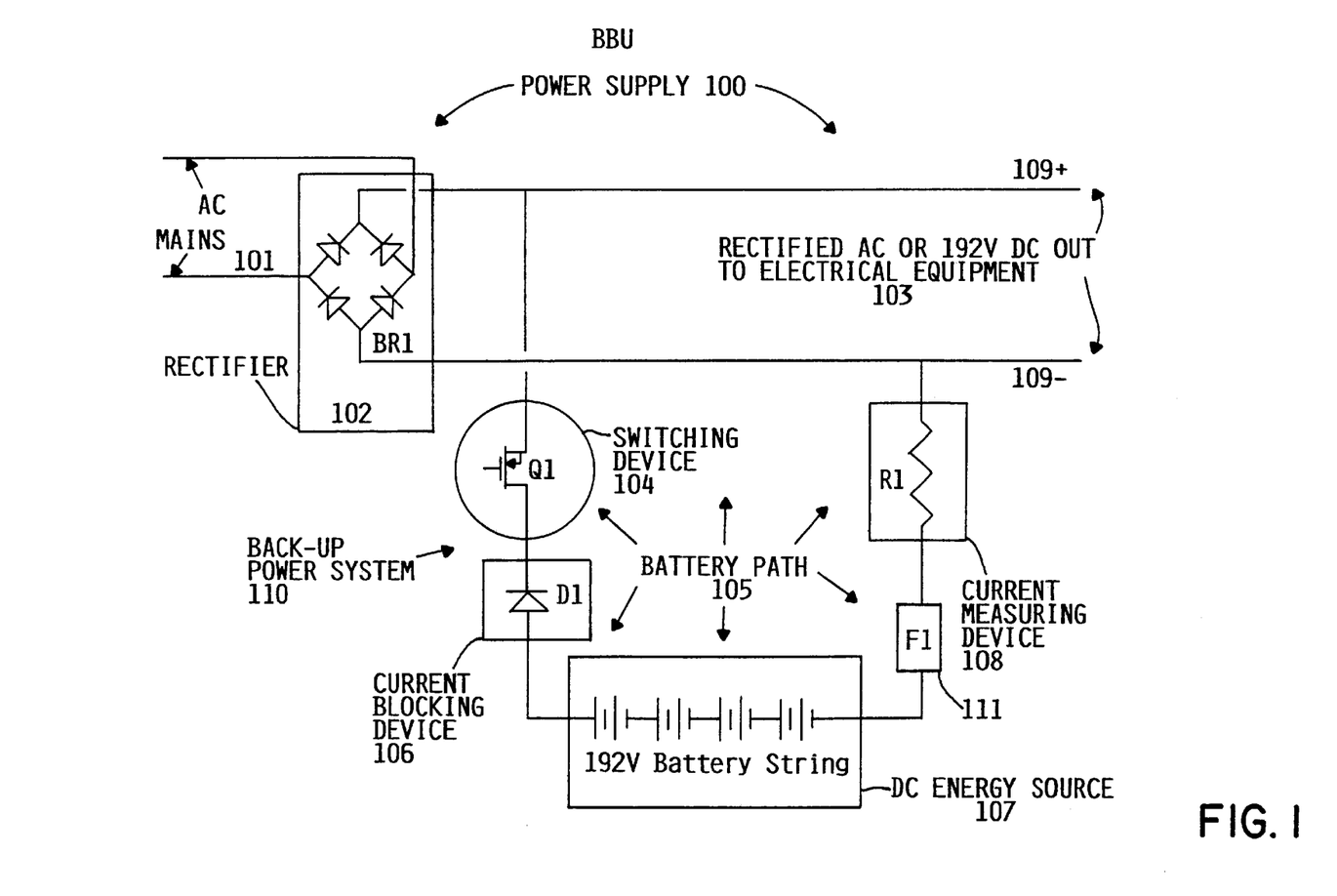
FIG. 1 illustrates a schematically a back-up power system in a power supply, according to an exemplary embodiment of the present invention.

One embodiment of the invention, which makes the battery path test substantially no-risk, is exemplified by the battery back-up architecture shown in FIG. 1. A typical power supply 100, having a battery back-up power system 110 incorporated therein or added thereto, is illustrated in FIG. 1. This power supply 100 so configured with the battery back-up power system 110, may also be referred to hereinafter as the battery back-up unit or simply the "BBU."

A primary source of alternating current/voltage (AC), sometimes referred to herein as the AC mains 101, is connected to the input of the BBU where the AC is subjected to rectification by a rectifier 102, e.g., a full-wave bridge rectifier (BR1). The rectified AC (also referred to herein as the DC pulses) output 103 is fed to the electrical equipment or system being backed-up (not shown) by the BBU, typically for further conditioning, e.g., filtering, power factor correcting, regulating to one or more nominal DC voltages (e.g., 3 VDC, 5 VDC and/or 12 VDC), and the like, as is known in the art. The electrical equipment being backed-up is also referred to as the "load" of the power supply 100.

Upon the occurrence of an AC mains 101 outage, i.e., a total loss of AC or a prolonged drop in the AC voltage being supplied from the AC mains 101 below an acceptable operational level, the switching device 104, e.g., MOSFET Q1, is activated to connect the back-up power system 110 to the output and thereby provide back-up power to the load. Although a MOSFET Q1 is illustrated for the switching device and is a preferred device, it should be apparent that practically any other switching device could be used, such as a mechanical switch, a relay switch, a reed switch or another type of solid state switching device, such as a silicon controlled rectifier (SCR).

In more detail, the battery back-up power system 110 in the battery path 105, includes the switching device 104 (MOSFET Q1), the current blocking device 106, e.g., diode D1, a DC energy source 107, e.g., a 192 VDC storage battery string, the current measuring device 108, e.g., a resistance R1, and a circuit protection device 111, e.g., a fuse (F1). This series string of components 104, 106, 107, 108 and 111, in the battery path 105, is connected to the output terminals 109+ and 109+ to provide back-up power to the electrical equipment or system being backed-up. When power from the AC mains 101 returns, the switching device 104 (Q1) is turned off, disconnecting the battery back-up power system 110 from the power supply 100 (BBU) output 103.

As with the switching device 104, the invention is not limited to the illustrated preferred embodiment. The current blocking device 106 could be a solid state diode as illustrated, or another functionally equivalent device, such as a transistor wired as a diode, or the like. The DC energy source 107 could be the string of batteries as illustrated, or could be any of a number of other DC sources, such as were mentioned above in the background section of this disclosure, including a dry cell electrical storage battery, a wet cell electrical storage battery, a fossil fuel powered electrical generator, a hydroelectric powered electrical generator, a wind powered electrical generator, a tide powered electrical generator, a solar powered steam turbine electrical generator, a nuclear powered steam turbine electrical generator, a fuel cell, or a photo-voltaic cell.

Further, although a resistance R1 is illustrated for the current measuring device 108, any type of device which can be used to give an indication of the test current could be used, such as a Hall effect device, a current pulse transformer, etc. A current measurement signal from the current measuring device 108 may be coupled directly, capacitively or inductively, for example, to detection/control circuitry (not shown).

Appropriate circuitry and/or software control for detecting the loss of main AC power 101 and controlling the switching device 104 (e.g., MOSFET Q1) to accomplish the battery back-up operation in the event of an outage is generally well understood in the art, and could take any number of forms, and, therefore, it is not illustrated for the sake of simplicity. A detailed description of such circuitry and/or software is not necessary for a complete understanding of the invention.

Although a fuse F1 is provided as the circuit protection device 111 in the exemplary embodiment of FIG. 1, a circuit breaker, or any other known circuit interrupting protection device could be provided, as would be recognized by one skilled in the art.

Figure 2:
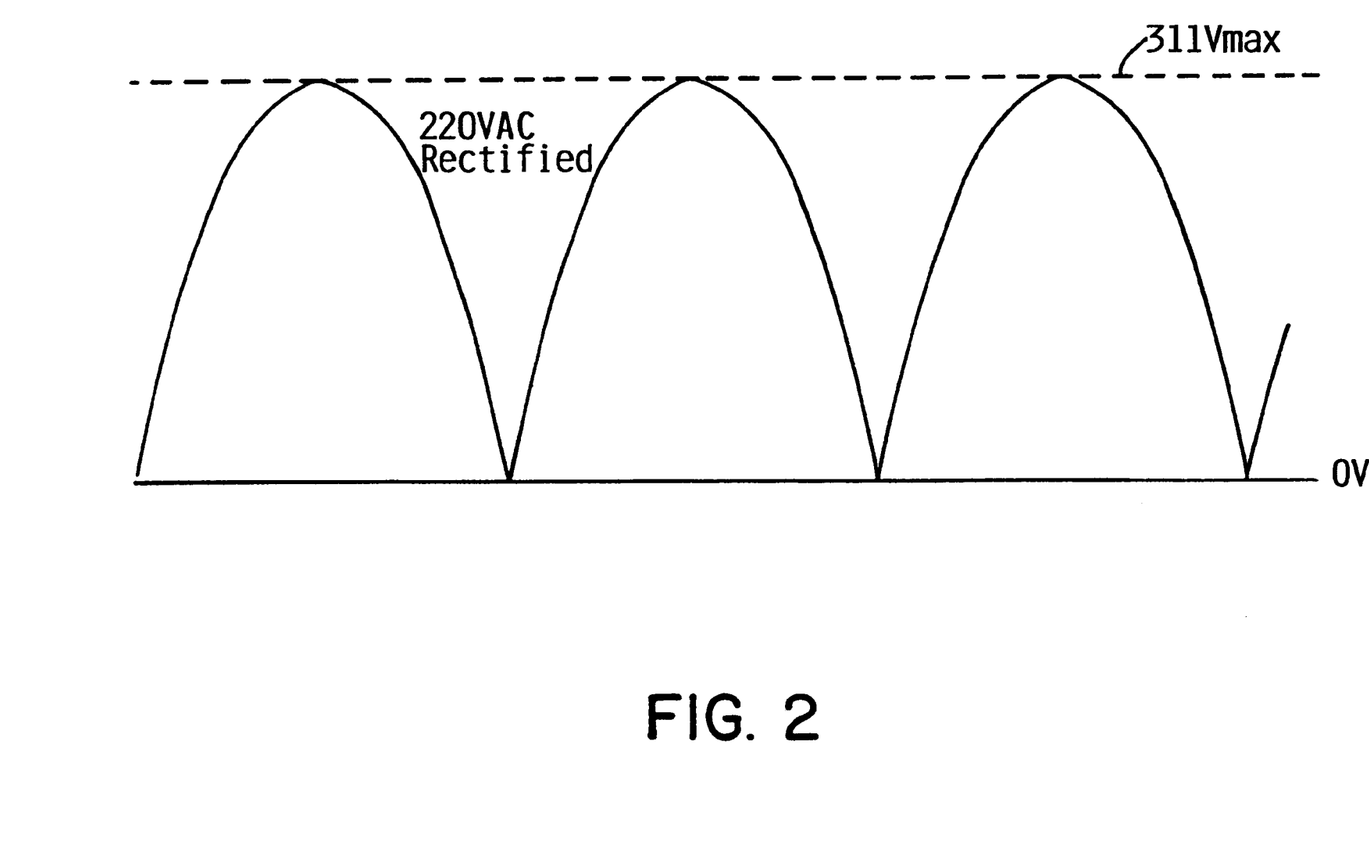
FIG. 2 illustrates normal power supply output voltage pulses before testing of the back-up power system according to an exemplary embodiment of the invention, for a typical mains input voltage of 220 VAC.

When the voltage level of the AC power mains 101 is "good," i.e., for a nominal 220 VAC mains, the input AC is between 179 VRMS and 260 VRMS (179 VRMS<AC mains voltage RMS<260 VRMS, and the battery back-up operation is therefore not initiated, the power supply 100 (BBU) output 103 is essentially as illustrated in FIG. 2, i.e., repetitive pulses of DC voltage/current. The voltage levels illustrated in FIG. 2 are for a typical power system output with a 220 VAC mains input.

According to the invention, with good AC input, that is, where there is no AC mains 101 outage occurring, a no-risk path test of the battery back-up power system 110 can be achieved by closing switching device 104 (MOSFET Q1). As will be described further, because of the exemplary architecture according to the invention, as illustrated in FIG. 1, there is no risk of crashing or otherwise adversely affecting a system being backed-up (e.g., a computer system) during testing of the battery back-up power system 110 of the power supply 100 (BBU).

Figure 3:
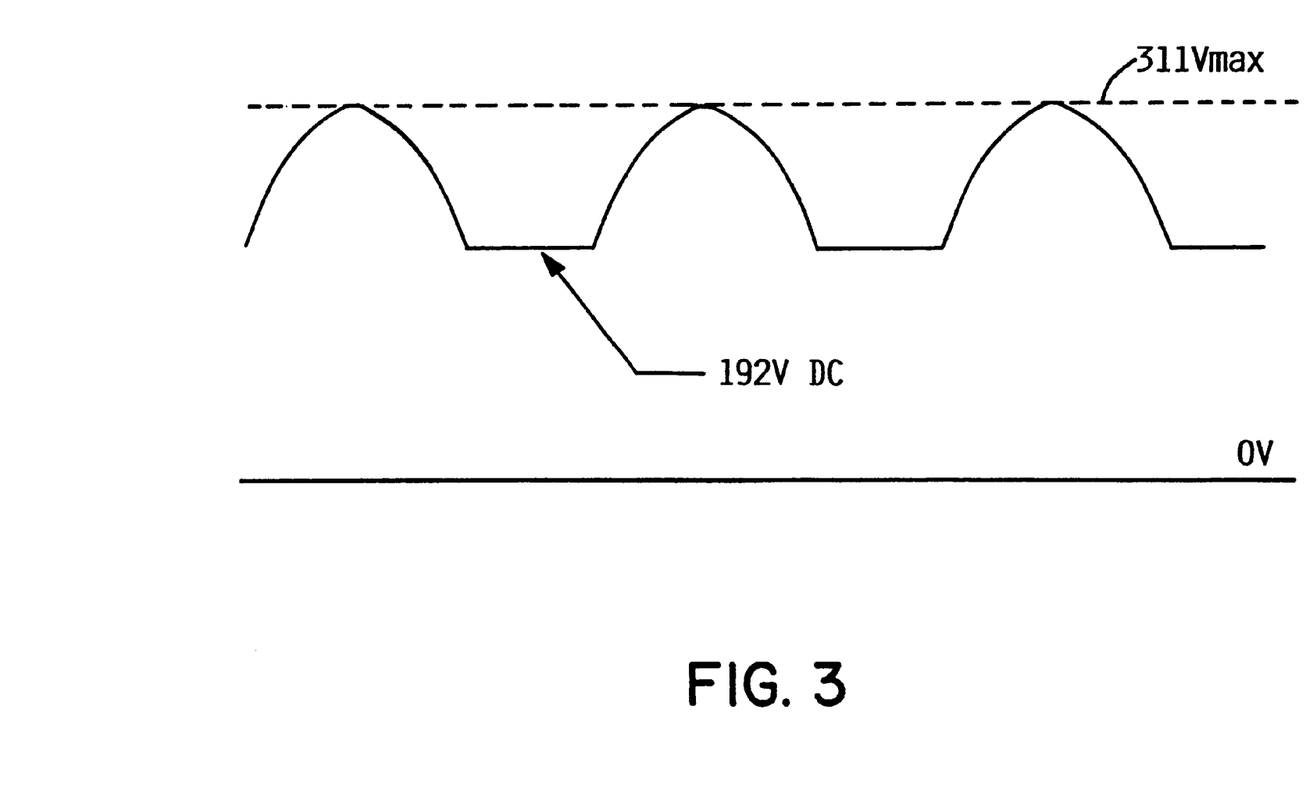
FIG. 3 illustrates power supply output voltage pulses during back-up power system testing according to an exemplary embodiment of the invention.

FIG. 3 shows the power supply 100 (BBU) output voltage while the switching device 104 (MOSFET Q1) is closed during a test procedure. As can be seen, the pulses of DC from the rectified AC mains are present, however, the output of the power supply 100 (BBU) also includes the approximately 192 VDC from the battery back-up power system 110 at times when the DC pulses from the rectified AC mains fall below approximately that level (approximately because of some small voltage drops of the components of the battery back-up power system 110, i.e., Q1, D1, the battery string and Ri which reduce the terminal voltage of the battery back-up power system 110, and because of the turn-on threshold of the switching device 104, e.g., the diode D1).

Figure 4:
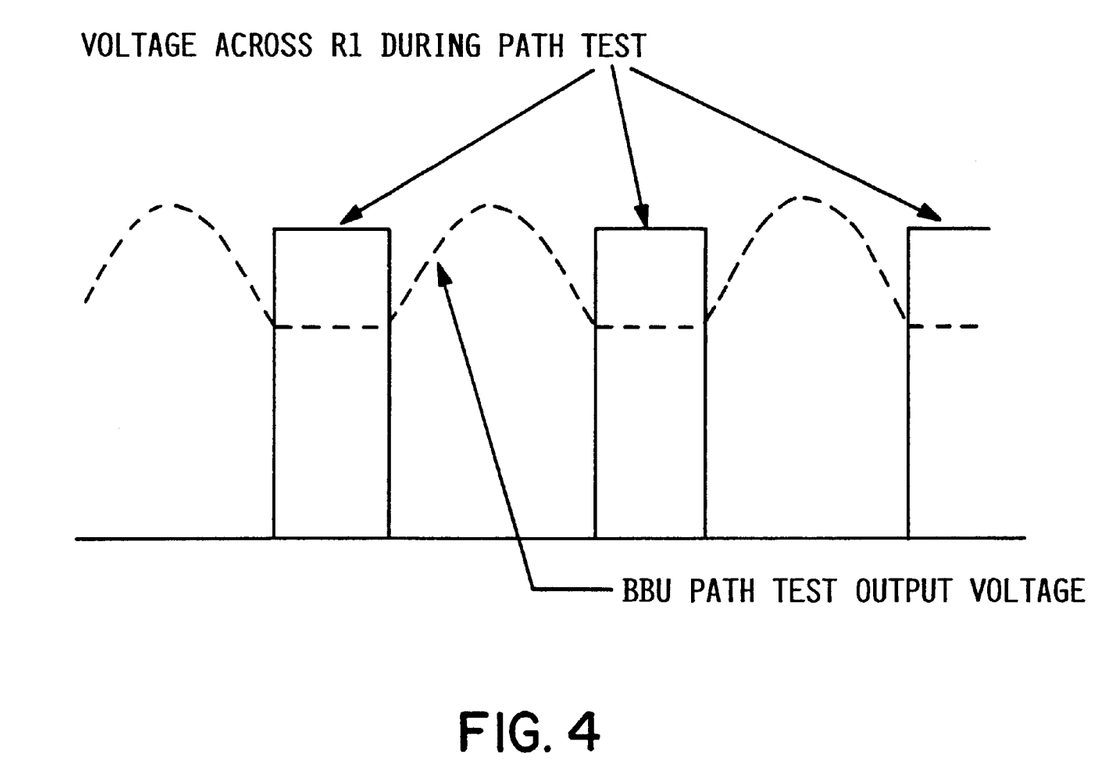
FIG. 4 illustrates voltage pulses developed across a resistance during testing according to an exemplary embodiment of the invention.

FIG. 4 shows the output of the power supply 100 with the battery back-up power system 110 during a battery path test. The dashed lines in FIG. 4 represent the output of the power supply 100 with the battery back-up connected during a path test. The test current is sensed as voltage pulses (shown in solid lines) across current measuring device 108, e.g., resistance R1, during a successful battery path test, i.e., where the back-up battery path is functioning correctly and up to specifications.

As can be seen in FIG. 3, during the path test, the DC energy source 107, e.g., the battery string, will "fill in" the valleys of the AC mains rectified voltage output (DC pulses) and supply pulses of DC current through the current measuring device 108 (as shown in FIG. 4) that can be sensed by external diagnostic circuits (not shown), e.g., coupled across resistance R1. Terminal voltages could also be measured by external diagnostic circuits, e.g., the voltage at the terminals of the battery string. By sensing and analyzing the current pulses/terminal voltage during the path test, it can be determined whether all components in the battery path 105 are in good operating condition. According to the invention, this testing is done without risking a crash or other adverse impact on the system the power supply 100 with back-up power system 110 is backing-up, by virtue of the fact that the rectified AC mains (DC pulses) is not disconnected from the power supply output during the testing.

As mentioned above, besides measuring the battery path current during testing, another measurement which could be made during the path test is the terminal voltage of the DC energy source 107, e.g., the 192 V battery string, and/or the complete battery back-up power system 110 terminal voltage, under load conditions. If the terminal voltage is below an acceptable level when an appropriate load test current flows through the battery path 105, then the diagnostic circuits (not shown) would sense this, and signal that the back-up power system 110 has a voltage problem and should be repaired or replaced.

Advantageously, according to the invention, if any of the components in the battery path 105, i.e., the switching device 104 (Q1), the current blocking device 106 (D1), the DC energy source 107 (the battery string), the circuit protection device 111 (fuse F1), or the current measuring device 108 (R1), fail open during the path test, the system being backed-up which is connected to the power supply 100 (BBU) will not be affected. That is, the system being backed-up, if a computer system, for example, will not experience a loss of power causing a crash. Rectified AC mains (DC pulses) will continue to be fed to the output 103 of the power supply 100 having the back-up power system 110, a condition no different than if the switching device 104 (Q1) was turned off. Such a failure would be detected, for example, as a lack of any battery path test current, and diagnostic circuitry (not shown) would signal that the back-up power system 110 is not operational and needs to be replaced.

Of course other failure modes besides an open component or components are possible. For example, a component or components of the back-up power system 110 could fail short, or a short circuit around one or more components could occur. Also, the DC energy source 107 (battery string) could fail, for example, with one or more bad cells. A battery string failure would result in a measured terminal voltage different from the expected terminal voltage. With a completely shorted and/or dead battery string 107, for example, the current blocking diode 106 (D1) would never turn on since it would always be reverse biased and never forward biased, and therefore, no test current would flow through the battery path 105.

As may be appreciated, a battery path failure mode where both the current blocking device 106 (diode D1) and the DC energy source 107 (battery string) are short-circuited could potentially cause the output of the power supply 100 to fail during path testing due to a very low resistance current path (approximately R1) across the output terminals 109+ and 109− of the power supply, potentially loading down the power supply. Additional precautions could be taken to prevent overloading the power supply in such a failure mode situation. (R1 would of course be a low resistance to minimize the voltage drop during operation of the load with battery back-up—likewise, the other components in the battery path 105 would have a low turn-on resistance for the same reason.) For example, because this failure mode would result in a large current through the battery path 105, one or more suitable fast-acting fuses or breakers 111 could be put in the battery path 105 to protect the other components, which would open should there be an over-current situation due to such a failure mode. In this way, the low resistance current path across the power supply output caused by the shorted components in the battery path 105, would be opened quickly before damage to either the power supply 100, or the equipment being backed-up has occurred, and without removing the main power supply output voltage at terminals 109+ and 109−. A protection mechanism such as this in the battery path 105 would be in addition to the normally provided fuse or circuit breaker in the path from the power supply 100 to the load (not shown).

Also, as should be apparent, the current through current measuring device 108 (R1) can be detected and if excessive due to a short circuit such as described above, for example, the switching device 104 (Q1) can be opened to end the test of the battery path 105 in a failure mode.

As is apparent, the current blocking device 104 (D1) functions to couple the DC energy source 107 (battery string) to the output terminals 109+ and 109− when the switching device 104 (Q1) is closed and the rectified AC instantaneous voltage level from the rectifier 102 falls to just below the DC energy source 107 (battery string) terminal voltage (see FIG. 3). Until that point, the rectified AC voltage keeps the current blocking device 106 (diode D1) reverse biased and, therefore, in an off condition.

The actual switching of the switching device 104 (Q1) from open to closed could be done at any point in time during the cycle of power supply output DC pulses. However, as should be appreciated, if the switching is done at a point where the DC pulse output is at an instantaneous level below the terminal voltage of the DC energy source (battery string), e.g., when the DC pulse is at zero volts, an undesirable spike of voltage could result at the output terminals 109+ and 109− of the power supply. That is, the voltage at the output terminals 109+ and 109− would suddenly rise from, e.g., zero volts, to approximately the terminal voltage of the DC energy source 107 (battery string). Of course, this may not be a problem if adequate measures (not shown) are provided to guard against voltage spikes reaching the electrical system being backed-up. Still, to completely avoid such a possibility during testing, it may be preferred that the closing of switching device 104 (Q1) be done at a point where the current blocking device 106 (diode D1) is reverse biased, i.e., when the DC pulse instantaneous voltage level is at or above the terminal voltage of the DC energy source 107 (battery string).

Of course, since one cannot predict where the instantaneous value of the DC pulses will be when an actual AC mains 101 or other main power supply failure occurs, i.e., under actual emergency back-up conditions, measures to prevent any negative effects from voltage spikes (when the switching device 104 closes) should be provided in any battery back-up power system as a matter of course.

As is known in the art, the DC pulses (rectified AC) at the output of a power supply are normally conditioned by additional circuitry for filtering, power factor correcting, and the like, and a battery path test architecture according to the invention would be completely compatible with such an arrangement, i.e., would not have any negative effects in this regards.

A battery back-up system such as that described would be suitable for use with an IBM AS/400 computer system, for example (IBM and AS/400 are registered trademarks of International Business Machines Corporation, all rights reserved). In a typical AS/400 computer system, the load put on the power supply would be in the neighborhood of 3000 Watts. Such a computer system would typically use a battery back-up unit (BBU) having a battery string providing approximately 192 V DC.

As would be apparent to those skilled in the art, various modifications of the preferred embodiment described above could be made within the spirit and scope of the invention. For example, although a full wave bridge rectifier 102 (BR1) is illustrated as part of the power supply 100, any type of rectifier could be used, for example, a half-wave rectifier, or a simple full-wave rectifier, providing an output of DC pulses.

Similarly, a number of different components could be used for the switching device 104, the current blocking device 106, the DC energy source 107, the circuit protection device 111, and the current measuring device 108, in accordance with the invention, and although some of these are mentioned herein, this is not meant to be an exhaustive or exclusive list of components, or to in any way limit the scope of equivalents thereto.

It will be apparent to one skilled in the art that the manner of making and using the claimed invention has been adequately disclosed in the above-written description of the preferred embodiments taken together with the drawings.

It will be understood that the above described preferred embodiments of the present invention are susceptible to various modifications, changes, and adaptations, and the same are intended to be comprehended within the meaning and range of equivalents of the appended claims.

What is claimed is:

1. A power supply comprising:
   a rectifier which receives alternating current as an input, and which provides a train of output pulses at an output terminal; and
   a battery back-up circuit coupled to the rectifier output terminal, for providing back-up power to the load;
   wherein the battery back-up circuit includes a series connection of a switching device, a current blocking device, at least one electrical energy storage battery, and a current measuring device;
   wherein the battery back-up circuit is tested while the rectifier is providing the output pulses by closing the switching device between the output pulses, and detecting at least one of:
      a test current flowing through the battery back-up circuit to the load; and
      a terminal voltage of the at least one electrical energy storage battery across the load.

2. The power supply according to claim 1, wherein the switching device comprises at least one of:
   a mechanical switch;
   a relay switch;
   a reed switch; and
   a solid state switching device.

3. The power supply according to claim 2, wherein the solid state switching device comprises at least one of:
   a bipolar transistor;
   a field effect transistor; and
   a silicon controlled rectifier.

4. The power supply according to claim 1, wherein the rectifier comprises a half-wave rectifier.

5. The power supply according to claim 1, wherein the rectifier comprises a full-wave rectifier.

6. The power supply according to claim 5, wherein the rectifier comprises a full-wave bridge rectifier.

7. The power supply according to claim 1, wherein the current blocking device comprises a diode.

8. The power supply according to claim 7, wherein the diode comprises a solid state diode.

9. The power supply according to claim 1, wherein the series connection further includes a circuit protection device;
   wherein the switching device comprises a transistor;
   wherein the current blocking device comprises a solid state diode;
   wherein the rectifier comprises a full-wave bridge rectifier; and
   wherein the current measuring device comprises a resistance.

10. The power supply according to claim 9, wherein the transistor comprises a field effect transistor.

11. The power supply according to claim 9, wherein the transistor comprises a bipolar transistor.

12. A method of testing a power supply used as a back-up power system without adversely affecting an electrical device load being backed-up, the method comprising utilizing the power supply according to claim 9.

13. The power supply according to claim 1, wherein the current measuring device comprises a resistance.

14. The power supply according to claim 1, wherein the current measuring device comprises a Hall effect device.

15. The power supply according to claim 1, wherein the current measuring device comprises an inductance.

16. The power supply according to claim 15, wherein the inductance comprises a pulse current transformer.

17. The power supply according to claim 1, wherein the current measuring device includes a capacitive coupling.

18. The power supply according to claim 1, wherein the current measuring device comprises a capacitance and an inductance.

19. The power supply according to claim 1, wherein the at least one electrical energy storage battery comprises a plurality of battery packs.

20. The power supply according to claim 19, wherein the plurality of battery packs comprises a plurality of 12 volt battery packs.

21. The power supply according to claim 19, wherein the plurality of battery packs comprises a plurality of 48 volt battery packs.

22. The power supply according to claim 1, wherein the output pulses provided by the rectifier have a peak voltage greater than a terminal voltage of the battery back-up circuit, whereby when the switching device is closed, and the instantaneous voltage of the output of the rectifier drops below the terminal voltage of the battery back-up circuit, the test current flows through the battery back-up circuit.

23. The power supply according to claim 22, wherein the alternating current input is from a nominal 220 volts root-mean-square source, wherein the peak voltage of the direct current output pulses provided by the rectifier is approximately 311 volts, and wherein the terminal voltage of the battery back-up circuit comprises approximately 192 volts minus any voltage drops and/or threshold voltages of the series connection components;

whereby, when the switching device is closed and the instantaneous voltage of the output of the rectifier drops below approximately 192 volts, the test current flows through the battery back-up circuit.

24. A method of testing a power supply used as a back-up power system without adversely affecting an electrical device load being backed-up, the method comprising utilizing the power supply according to claim 1.

25. A power supply comprising:

a rectifier which receives alternating current as an input, and which provides a train of output pulses at an output terminal; and a back-up circuit coupled to the rectifier output terminal, for providing back-up power to the load;

wherein the back-up circuit includes a series connection of a switching device, a current blocking device, at least one electrical energy source device, a circuit protection device, and a current measuring device;

wherein the back-up circuit can be tested while the rectifier is providing the output pulses by closing the switching device between the output pulses, and detecting at least one of:

a test current flowing through the back-up circuit to the load; and a terminal voltage of the at least one electrical energy source device during the testing across the load.

26. The power supply according to claim 25, wherein the at least one electrical energy source device comprises at least one of:

a dry cell electrical storage battery;

a wet cell electrical storage battery;

a fossil fuel powered electrical generator;

a hydroelectric powered electrical generator;

a wind powered electrical generator;

a tide powered electrical generator;

a solar powered steam turbine electrical generator;

a nuclear powered steam turbine electrical generator;

a fuel cell; and a photo-voltaic cell.

27. A method of testing a back-up power system having a series connection of a switching device, a current blocking device, at least one electrical energy source device, a circuit protection device, and a current measuring device, in a power supply without adversely affecting an electrical device load being backed-up, the method comprising:

supplying a train of rectified current pulses to the load at output terminals of the power supply;

while the train of rectified current pulses is being supplied to the load at the output terminals of the power supply, connecting the back-up power system to the output terminals of the power supply by closing the switching device between the current pulses; and detecting at least one electrical parameter of the back-up power system.

28. The method according to claim 27, wherein the at least one electrical parameter of the back-up power system comprises a current magnitude flowing through the back-up power system to the load.

29. The method according to claim 27, wherein the at least one electrical parameter of the back-up power system comprises a terminal voltage magnitude of the back-up power system across the load.

30. The method according to claim 27, further comprising:

prior to the connecting the back-up power system to the output terminals of the power supply, measuring a terminal voltage of the back-up power system; and if the measured terminal voltage of back-up power system is below a threshold, signaling a back-up power system problem and aborting further testing.

* * * * *